(12) United States Patent
Chuang et al.

(10) Patent No.: US 12,119,272 B2
(45) Date of Patent: *Oct. 15, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Fu-Jung Chuang, Kaohsiung (TW); Po-Jen Chuang, Kaohsiung (TW); Yu-Ren Wang, Tainan (TW); Chi-Mao Hsu, Tainan (TW); Chia-Ming Kuo, Kaohsiung (TW); Guan-Wei Huang, Tainan (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/233,331

(22) Filed: Aug. 14, 2023

(65) Prior Publication Data
US 2023/0386939 A1    Nov. 30, 2023

Related U.S. Application Data

(60) Continuation of application No. 17/981,499, filed on Nov. 7, 2022, now Pat. No. 11,791,219, which is a continuation of application No. 17/134,465, filed on Dec. 27, 2020, now Pat. No. 11,527,448, which is a division of application No. 16/802,463, filed on Feb.
(Continued)

(30) Foreign Application Priority Data

Jun. 12, 2018   (TW) .................. 107120159

(51) Int. Cl.
H01L 21/00      (2006.01)
H01L 21/762     (2006.01)
H01L 21/8238    (2006.01)
H01L 27/092     (2006.01)

(52) U.S. Cl.
CPC ............. *H01L 21/823878* (2013.01); *H01L 21/76224* (2013.01); *H01L 21/823821* (2013.01); *H01L 27/0924* (2013.01)

(58) Field of Classification Search
CPC ....... H01L 21/823878; H01L 21/76224; H01L 21/823821; H01L 27/0924
See application file for complete search history.

(56) References Cited

U.S. PATENT DOCUMENTS 8,878,309 B1    11/2014  Hong
9,570,442 B1    2/2017   Liu
(Continued)

FOREIGN PATENT DOCUMENTS

CN    107346739 A    11/2017
TW    202002017 A    1/2020

*Primary Examiner* — Richard A Booth
(74) *Attorney, Agent, or Firm* — Winston Hsu

(57) ABSTRACT

A semiconductor device includes a fin-shaped structure on a substrate, a single diffusion break (SDB) structure in the fin-shaped structure to divide the first fin-shaped structure into a first portion and a second portion, and more than two gate structures on the SDB structure. Preferably, the more than two gate structures include a first gate structure, a second gate structure, a third gate structure, and a fourth gate structure disposed on the SDB structure.

10 Claims, 10 Drawing Sheets

Related U.S. Application Data 26, 2020, now Pat. No. 10,910,277, which is a continuation-in-part of application No. 16/589,032, filed on Sep. 30, 2019, now Pat. No. 10,607,897, which is a division of application No. 16/030,871, filed on Jul. 10, 2018, now Pat. No. 10,475,709.

(56) References Cited

U.S. PATENT DOCUMENTS

| | | |
|---|---|---|
| 9,589,845 B1 | 3/2017 | Jagannathan |
| 9,653,583 B1 | 5/2017 | Zhao |
| 9,805,989 B1 | 10/2017 | Adusumilli |
| 10,008,599 B1 | 6/2018 | Hsu |
| 10,475,709 B1 | 11/2019 | Chuang |
| 10,910,277 B2 * | 2/2021 | Chuang ........... H01L 21/823878 |
| 11,527,448 B2 * | 12/2022 | Chuang ........... H01L 21/823878 |
| 2007/0148840 A1 | 6/2007 | Sheen |
| 2009/0242995 A1 | 10/2009 | Suzuki |
| 2012/0032332 A1 | 2/2012 | Lim |
| 2015/0294969 A1 * | 10/2015 | Lee .................... H01L 29/7856 |
| | | 257/401 |
| 2016/0276429 A1 | 9/2016 | Tseng |
| 2017/0309611 A1 | 10/2017 | Liu |
| 2018/0138172 A1 | 5/2018 | Chen |
| 2018/0204840 A1 | 7/2018 | Peng |
| 2019/0006360 A1 | 1/2019 | Tung |
| 2019/0027602 A1 | 1/2019 | Lee |
| 2019/0067567 A1 | 2/2019 | Tseng |

\* cited by examiner

SEMICONDUCTOR DEVICE AND METHOD FOR FABRICATING THE SAME

CROSS REFERENCE TO RELATED APPLICATIONS

This application is a continuation application of U.S. application Ser. No. 17/981,499, filed on Nov. 7, 2022, which is a continuation application of U.S. application Ser. No. 17/134,465, filed on Dec. 27, 2020, which is a division of U.S. application Ser. No. 16/802,463, filed on Feb. 26, 2020, which is a continuation-in-part of U.S. application Ser. No. 16/589,032, filed on Sep. 30, 2019, which is a division of U.S. application Ser. No. 16/030,871, filed on Jul. 10, 2018. The contents of these applications are incorporated herein by reference.

BACKGROUND OF THE INVENTION

1. Field of the Invention

The invention relates to a method for fabricating semiconductor device, and more particularly to a method for dividing fin-shaped structure to form single diffusion break (SDB) structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, after shallow trench isolation (STI) is formed around the fin-shaped structure part of the fin-shaped structure and part of the STI could be removed to form a trench, and insulating material is deposited into the trench to form single diffusion break (SDB) structure or isolation structure. However, the integration of the SDB structure and metal gate fabrication still remains numerous problems. Hence how to improve the current FinFET fabrication and structure has become an important task in this field.

SUMMARY OF THE INVENTION

According to an embodiment of the present invention, a method for fabricating semiconductor device includes the steps of: providing a substrate having a first region and a second region; forming a first fin-shaped structure on the first region; removing part of the first fin-shaped structure to form a first trench; forming a dielectric layer in the first trench, wherein the dielectric layer comprises silicon oxycarbonitride (SiOCN); and planarizing the dielectric layer to form a first single diffusion break (SDB) structure.

According to another aspect of the present invention, a semiconductor device includes: a substrate having a first region and a second region; a first fin-shaped structure on the first region; and a first single diffusion break (SDB) structure in the first fin-shaped structure to divide the first fin-shaped structure into a first portion and a second portion. Preferably, the first SDB structure comprises silicon oxycarbonitride (SiOCN).

According to yet another aspect of the present invention, a method for fabricating semiconductor device includes the steps of first providing a substrate having a fin-shaped structure thereon, forming a single diffusion break (SDB) structure in the substrate to divide the fin-shaped structure into a first portion and a second portion, and then forming more than one gate structures such as a first gate structure and a second gate structure on the SDB structure. Preferably, each of the first gate structure and the second gate structure overlaps the fin-shaped structure and the SDB structure.

According to yet another aspect of the present invention, a semiconductor device includes a fin-shaped structure on a substrate, a single diffusion break (SDB) structure in the fin-shaped structure to divide the first fin-shaped structure into a first portion and a second portion, and more than one gate structures such as a first gate structure and a second gate structure disposed on the SDB structure. Preferably, each of the first gate structure and the second gate structure overlaps the fin-shaped structure and the SDB structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
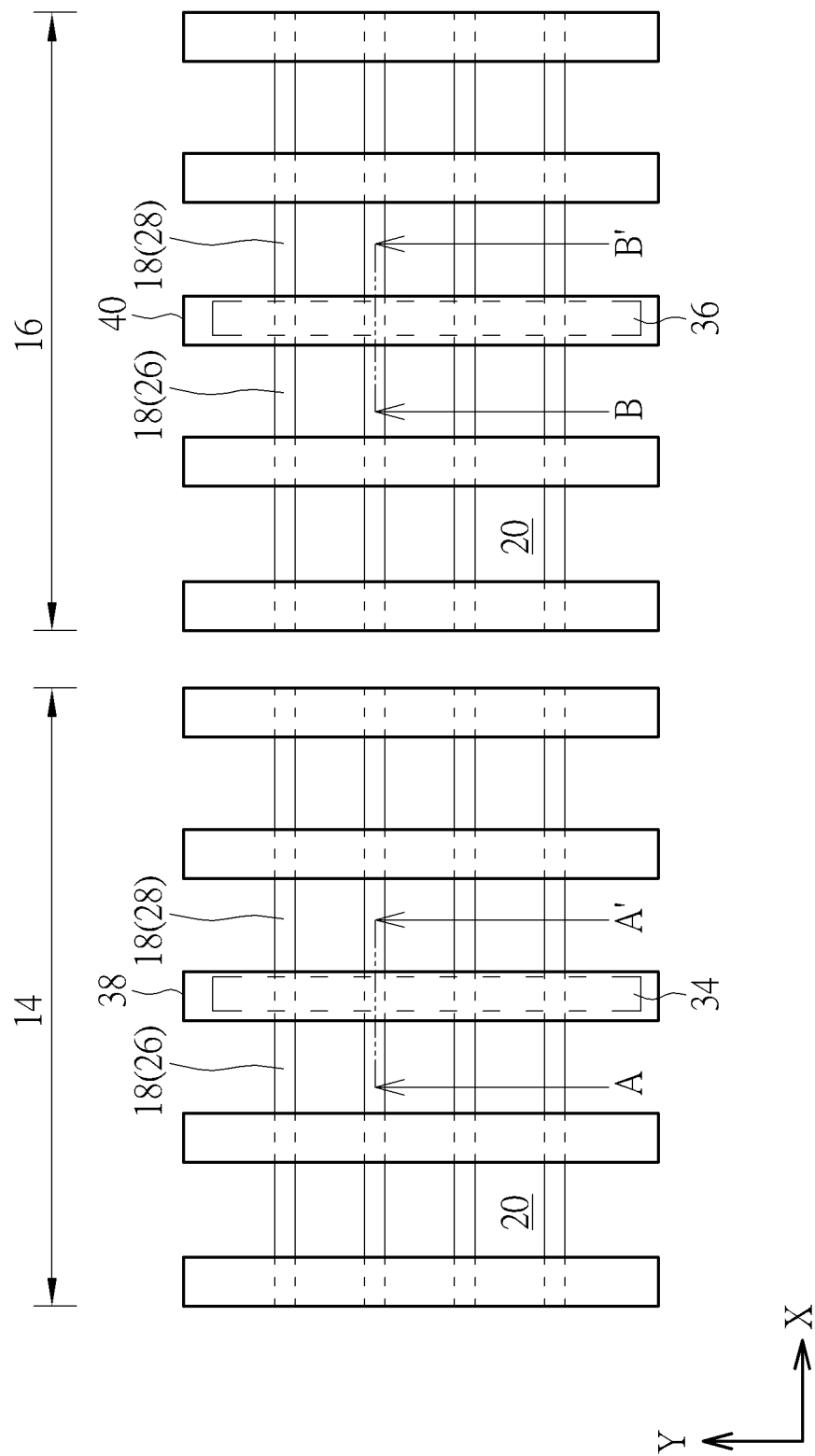
FIG. 1 is a top view illustrating a method for fabricating a semiconductor device according to an embodiment of the present invention.
Figure 2:
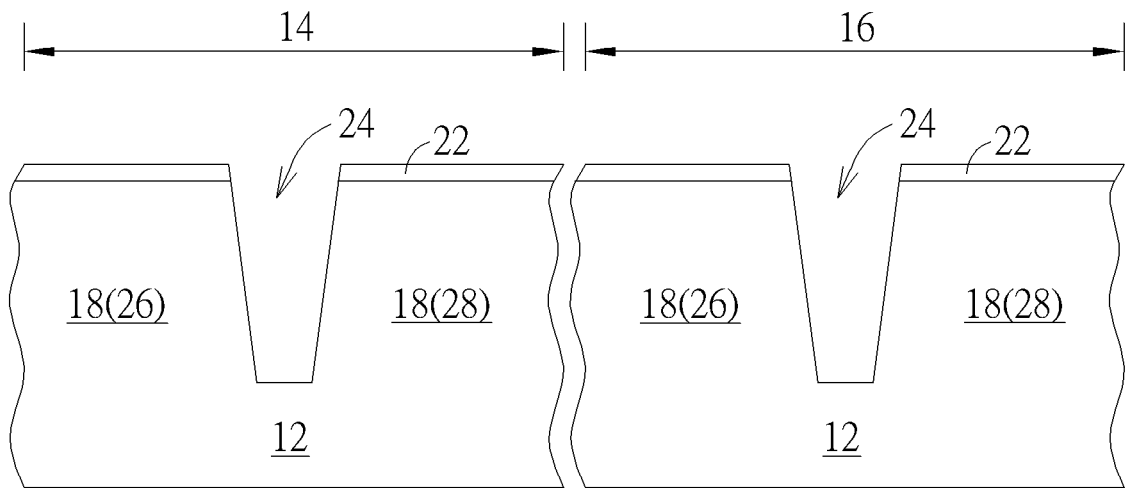
FIGS. 2-7 illustrate a method for fabricating a semiconductor device according to an embodiment of the present invention.

Referring to FIGS. 1-2, in which FIG. 1 is a top view illustrating a method for fabricating a semiconductor device according to an embodiment of the present invention, the left portion of FIG. 2 illustrates a cross-sectional view of FIG. 1 for fabricating the semiconductor device along the sectional line AA', and the right portion of FIG. 2 illustrates a cross-sectional view of FIG. 1 for fabricating the semiconductor device along the sectional line BB'. As shown in FIGS. 1-2, a substrate 12, such as a silicon substrate or silicon-on-insulator (SOI) substrate is first provided, a first region such as a NMOS region 14 and a second region such as a PMOS region 16 are defined on the substrate 12, and at least a fin-shaped structure 18 is formed on each of the NMOS region 14 and PMOS region 16. It should be noted that even though four fin-shaped structures 18 are disposed on each of the transistor regions in this embodiment, it would also be desirable to adjust the number of fin-shaped structures 18 depending on the demand of the product, which is also within the scope of the present invention.

Preferably, the fin-shaped structures 18 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18 could also be obtained by first forming a patterned mask (not shown) on the substrate, 12, and through an etching process, the pattern of the patterned mask is transferred to the substrate 12 to form the fin-shaped structures 18. Moreover, the formation of the fin-shaped structures 18 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 18. These approaches for forming fin-shaped structure are all within the scope of the present invention. It should be noted that after the fin-shaped structures 18 are formed, a liner 22 made of silicon oxide could be formed on the surface of the fin-shaped structures 18 on the NMOS region 14 and PMOS region 16.

Next, a shallow trench isolation (STI) 20 is formed around the fin-shaped structures 18. In this embodiment, the formation of the STI 20 could be accomplished by conducting a flowable chemical vapor deposition (FCVD) process to form a silicon oxide layer on the substrate 12 and covering the fin-shaped structures 18 entirely. Next, a chemical mechanical polishing (CMP) process along with an etching process are conducted to remove part of the silicon oxide layer so that the top surface of the remaining silicon oxide is slightly lower than the top surface of the fin-shaped structures 18 for forming the STI 20.

Next, as shown in FIG. 2, an etching process is conducted by using a patterned mask (not shown) as mask to remove part of the liner 22 and part of the fin-shaped structures 18 to form trenches 24, in which each of the trenches 24 preferably divides each of the fin-shaped structures 18 disposed on the NMOS region 14 and PMOS region 16 into two portions, including a portion 26 on the left side of the trench 24 and a portion 28 on the right side of the trench 24.

Figure 3:
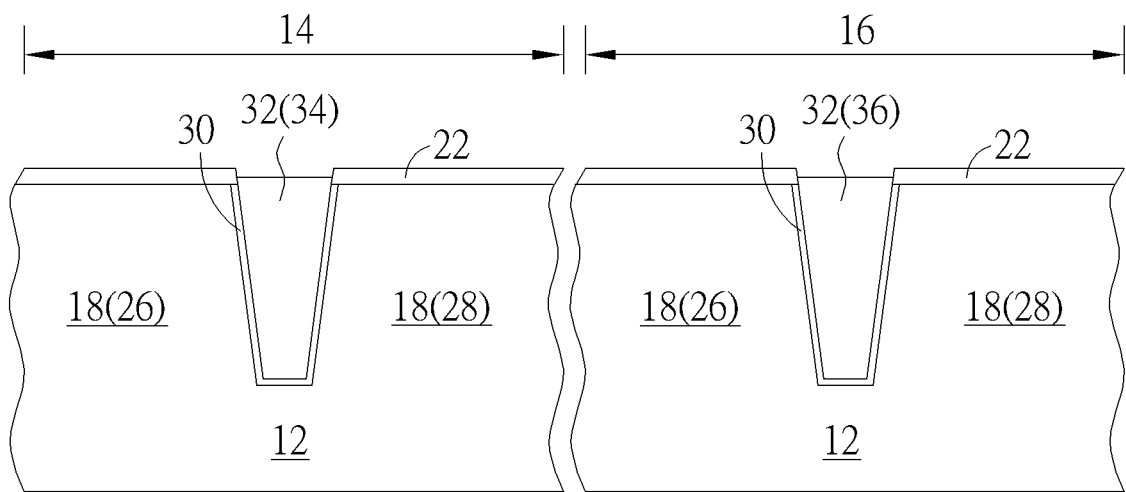

Next, as shown in FIG. 3, an oxidation process is conducted to form another liner 30 made of silicon oxide in the trenches 24 on the NMOS region 14 and PMOS region 16, in which the liner 30 is disposed on the bottom surface and two sidewalls of the trenches 24 and contacting the liner 22 directly. Next, a dielectric layer 32 is formed in the trenches 24 and filling the trenches 24 completely, and a planarizing process such as chemical mechanical polishing (CMP) process and/or etching process is conducted to remove part of the dielectric layer 32 so that the top surface of the remaining dielectric layer 32 is even with or slightly higher than the top surface of the fin-shaped structures 18. This forms SDB structures 34, 36 on the NMOS region 14 and PMOS region 16 respectively.

As shown in FIG. 1, each of the fin-shaped structures 18 on the NMOS region 14 and PMOS region 16 are disposed extending along a first direction (such as X-direction) while the SDB structures 34, 36 are disposed extending along a second direction (such as Y-direction), in which the first direction is orthogonal to the second direction.

It should be noted that the dielectric layer 32 and the liner 30 in this embodiment are preferably made of different materials, in which the liner 30 is preferably made of silicon oxide and the dielectric layer 32 is made of silicon oxycarbonitride (SiOCN). Specifically, the SDB structures 34, 36 made of SiOCN in this embodiment are preferably structures having low stress, in which the concentration proportion of oxygen within SiOCN is preferably between 30% to 60% and the stress of each of the SDB structures 34, 36 is between 100 MPa to −500 MPa or most preferably at around 0 MPa. In contrast to the conventional SDB structures made of dielectric material such as silicon oxide or silicon nitride, the SDB structures of this embodiment made of low stress material such as SiOCN could increase the performance of on/off current in each of the transistors thereby boost the performance of the device.

Figure 4:
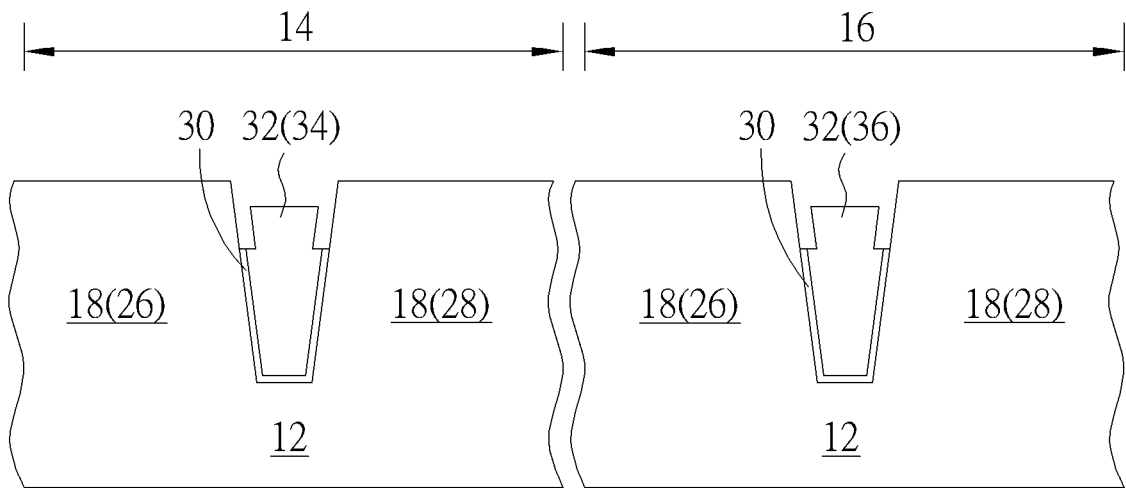

Next, as shown in FIG. 4, an ion implantation process could be conducted to form deep wells or well regions in the fin-shaped structures 18 on the NMOS region 14 and PMOS region 16, and a clean process could be conducted by using diluted hydrofluoric acid (dHF) to remove the liner 22 on the surface of the fin-shaped structures 18 completely, part of the liner 30 on sidewalls of the trenches 24, and even part of the SDB structures 34, 36. This exposes the surface of the fin-shaped structures 18 and the top surfaces of the remaining liner 30 and the SDB structures 34, 36 are slightly lower than the top surface of the fin-shaped structures 18 while the top surface of the SDB structures 34 36 is also slightly higher than the top surface of the remaining liner 30.

Figure 5:
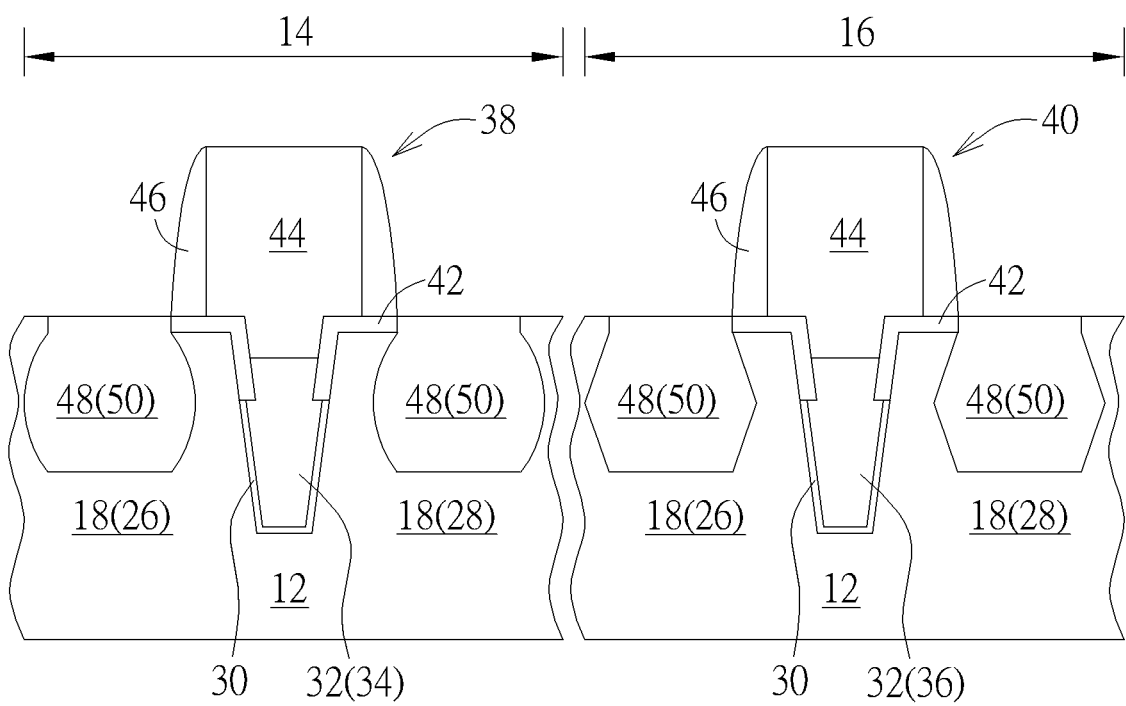

Next, as shown in FIG. 5, at least a gate structure such as gate structures 38, 40 or dummy gates are formed on the fin-shaped structures 18 on the NMOS region 14 and PMOS region 16. In this embodiment, the formation of the first gate structure 38, 40 could be accomplished by a gate first process, a high-k first approach from gate last process, or a high-k last approach from gate last process. Since this embodiment pertains to a high-k last approach, a gate dielectric layer 42 or interfacial layer, a gate material layer 44 made of polysilicon, and a selective hard mask could be formed sequentially on the substrate 12 or fin-shaped structures 18, and a photo-etching process is then conducted by using a patterned resist (not shown) as mask to remove part of the gate material layer 44 and part of the gate dielectric layer 42 through single or multiple etching processes. After stripping the patterned resist, gate structures 38, 40 each composed of a patterned gate dielectric layer 42 and a patterned material layer 44 are formed on the fin-shaped structures 18.

Next, at least a spacer 46 is formed on sidewalls of the each of the gate structures 38, 40, a source/drain region 48 and/or epitaxial layer 50 is formed in the fin-shaped structure 18 adjacent to two sides of the spacer 46, and selective silicide layers (not shown) could be formed on the surface of the source/drain regions 48. In this embodiment, each of the spacers 46 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 48 and epitaxial layers 50 could include different dopants and/or different materials depending on the conductive type of the device being fabricated. For instance, the source/drain region 48 on the NMOS region 14 could include n-type dopants and the epitaxial layer 50 on the same region could include silicon phosphide (SiP) while the source/drain region 48 on the PMOS region 16 could include p-type dopants and the epitaxial layer 50 on the same region could include silicon germanium (SiGe).

Figure 6:
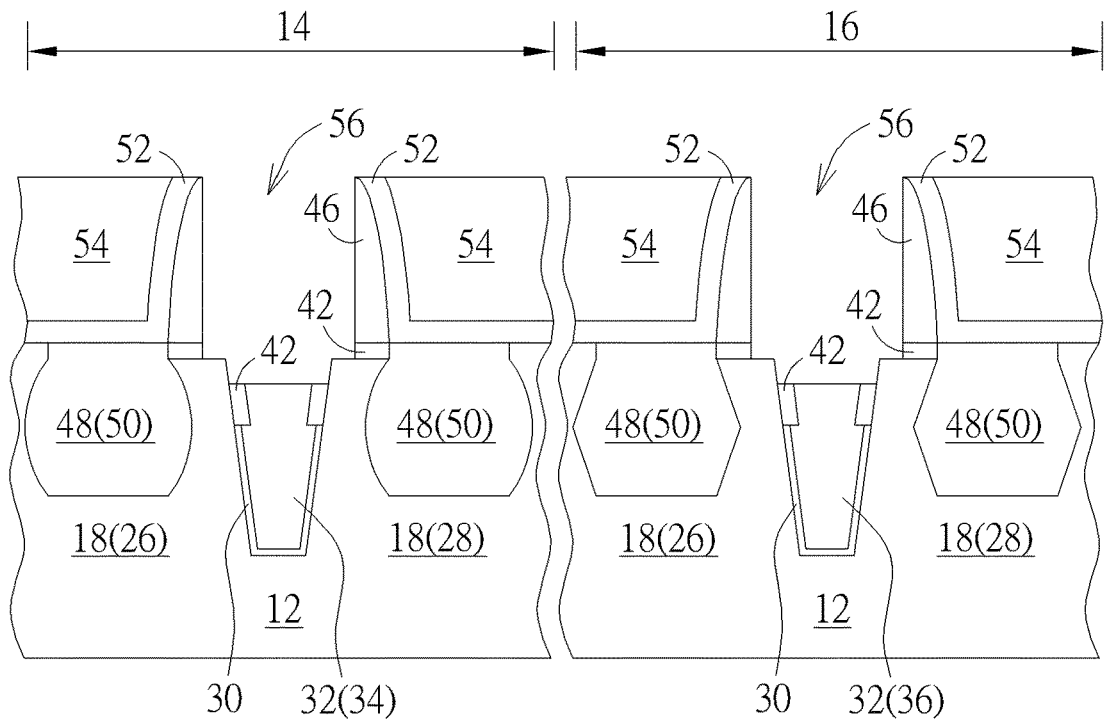

Next, as shown in FIG. 6, a contact etch stop layer (CESL) 52 is formed on the surface of the fin-shaped structures 18 and covering the gate structures 38, 40, and an interlayer dielectric (ILD) layer 54 is formed on the CESL 52. Next, a planarizing process such as CMP is conducted to remove part of the ILD layer 54 and part of the CESL 52 for exposing the gate material layer 44 made of polysilicon, in which the top surface of the gate material layer 44 is even with the top surface of the ILD layer 54.

Next, a replacement metal gate (RMG) process is conducted to transform the gate structures 38, 40 into metal gates 58, 60. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 44 and even gate dielectric layer 42 from the gate structures 38, 40 for forming recesses 56 in the ILD layer 54.

Figure 7:
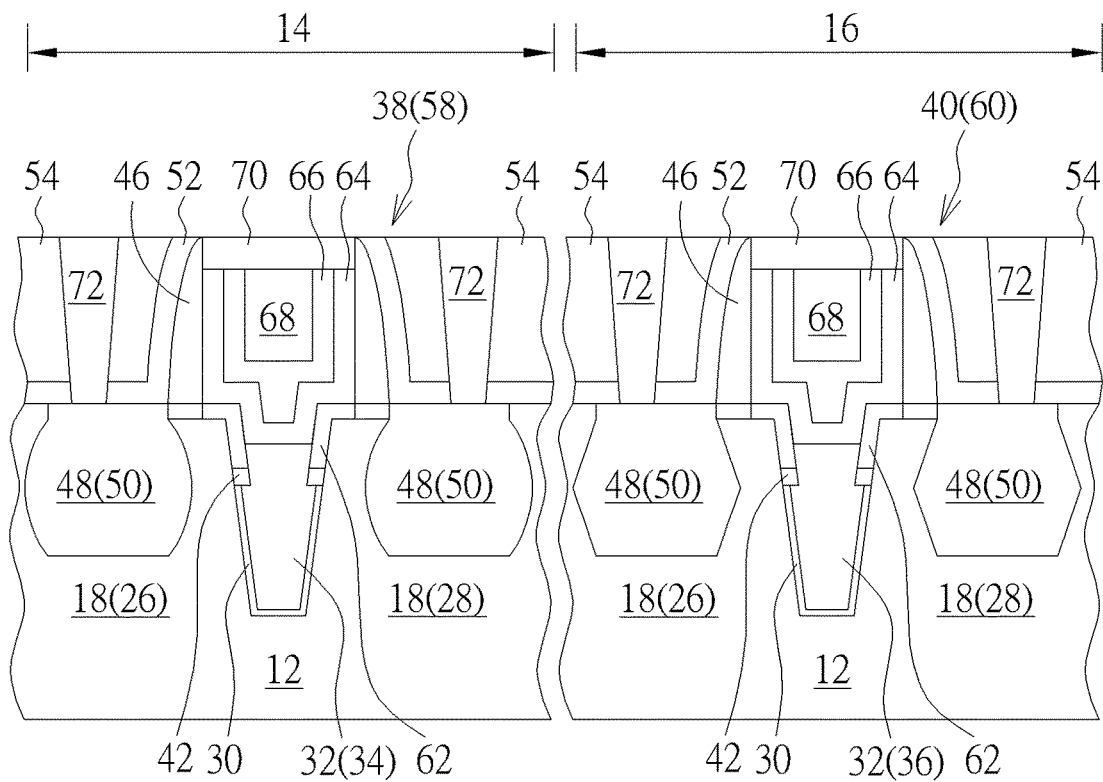

Next, as shown in FIG. 7, a selective interfacial layer or gate dielectric layer 62, a high-k dielectric layer 64, a work function metal layer 66, and a low resistance metal layer 68 are formed in the recesses 56, and a planarizing process such as CMP is conducted to remove part of low resistance metal layer 68, part of work function metal layer 66, and part of high-k dielectric layer 64 to form metal gates 58, 60. Next, part of the low resistance metal layer 68, part of the work function metal layer 66, and part of the high-k dielectric layer 64 are removed to form a recess (not shown) on each of the transistor region, and a hard mask 70 made of dielectric material including but not limited to for example silicon nitride is deposited into the recesses so that the top surfaces of the hard mask 70 and ILD layer 54 are coplanar. In this embodiment, each of the gate structures or metal gates 58, 60 fabricated through high-k last process of a gate last process preferably includes an interfacial layer or gate dielectric layer 62, a U-shaped high-k dielectric layer 64, a U-shaped work function metal layer 66, and a low resistance metal layer 68.

In this embodiment, the high-k dielectric layer 64 is preferably selected from dielectric materials having dielectric constant (k value) larger than 4. For instance, the high-k dielectric layer 64 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 66 is formed for tuning the work function of the metal gate in accordance with the conductivity of the device. For an NMOS transistor, the work function metal layer 66 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 66 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 66 and the low resistance metal layer 68, in which the material of the barrier layer may include titanium (Ti), titanium nitride (TiN), tantalum (Ta) or tantalum nitride (TaN). Furthermore, the material of the low-resistance metal layer 68 may include copper (Cu), aluminum (Al), titanium aluminum (TiAl), cobalt tungsten phosphide (CoWP) or any combination thereof.

Next, a pattern transfer process is conducted by using a patterned mask (not shown) as mask to remove part of the ILD layer 54 and part of the CESL 52 for forming contact holes (not shown) exposing the source/drain regions 48 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 72 electrically connecting the source/drain regions 48. This completes the fabrication of a semiconductor device according to a preferred embodiment of the present invention.

It should be noted that even though SDB structures 34, 36 are formed on the NMOS region 14 and PMOS region 16 at the same time in the aforementioned embodiment, it would also be desirable to follow the aforementioned process to form SDB structure only on the NMOS region 14 or the PMOS region 16 and then conduct gate structure formation and RMG process afterwards, which is also within the scope of the present invention.

Preferably, the present invention first forms fin-shaped structures on the NMOS region and/or PMOS region, divides each of the fin-shaped structures into two portions by forming at least a trench in the fin-shaped structures, and then deposits a dielectric material into the trenches on both transistors at the same time to form SDB structures. According to a preferred embodiment of the present invention, the SDB structures formed on the NMOS region and PMOS region are preferably made of SiOCN, in which the proportion of oxygen concentration in SiOCN is preferably between 30% to 60% and the stress of each of the SDB structures 34, 36 is preferably between 100 MPa to −500 MPa. In contrast to the conventional SDB structures made of dielectric material such as silicon oxide or silicon nitride, the SDB structures of the present invention made of low stress material such as SiOCN could increase the performance of on/off current in each of the transistors and boost the performance of the device substantially.

Figure 8:
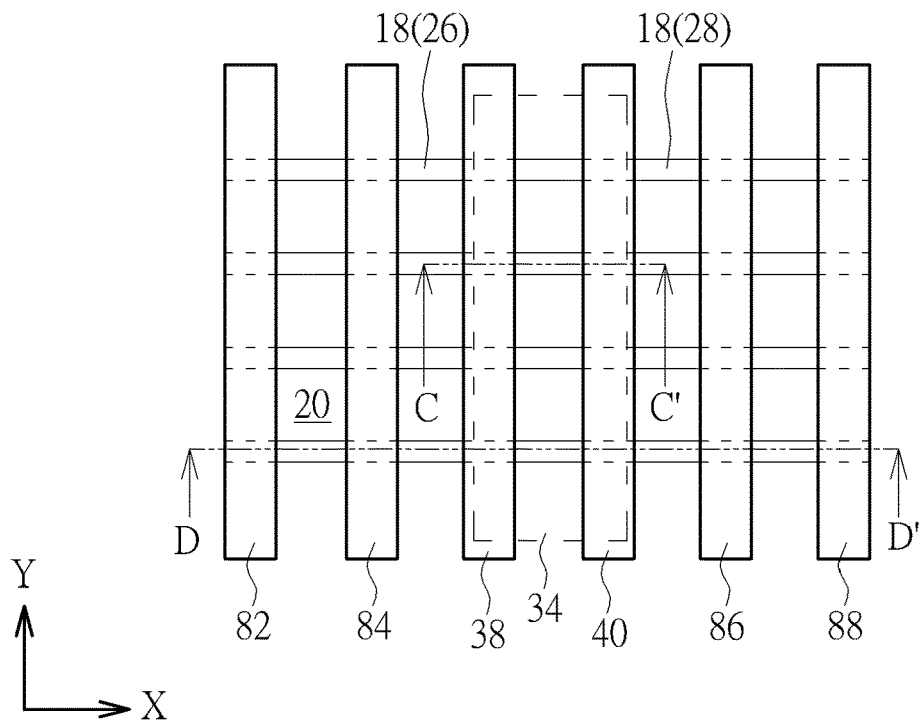
FIG. 8 is a top view illustrating a method for fabricating a semiconductor device according to an embodiment of the present invention.
Figure 9:
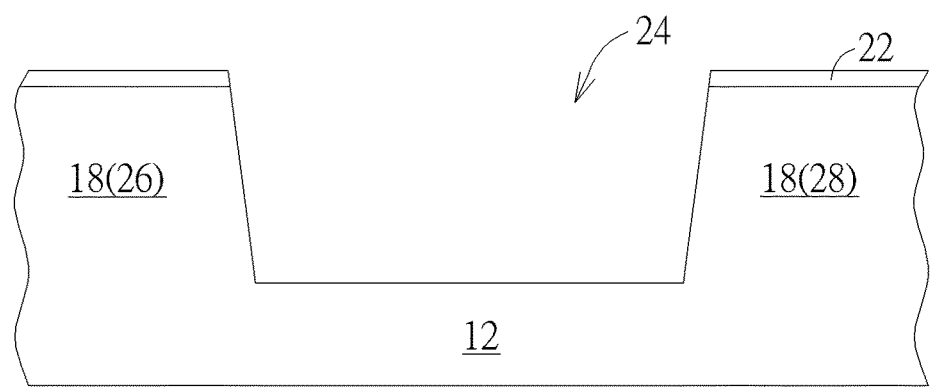
FIGS. 9-13 illustrate a method for fabricating a semiconductor device according to an embodiment of the present invention.

Referring to FIGS. 8-9, FIG. 8 is a top view illustrating a method for fabricating a semiconductor device according to an embodiment of the present invention and FIG. 9 illustrates a cross-sectional view of FIG. 8 for fabricating the semiconductor device along the sectional line CC'. As shown in FIGS. 8-9, a substrate 12, such as a silicon substrate or silicon-on-insulator (SOI) substrate is first provided, a transistor region such as a NMOS region or a PMOS region is defined on the substrate 12, and at least a fin-shaped structure 18 is formed on the substrate. It should be noted that even though four fin-shaped structures 18 are disposed on each of the transistor regions in this embodiment, it would also be desirable to adjust the number of fin-shaped structures 18 depending on the demand of the product, which is also within the scope of the present invention. Moreover, elements such as fin-shaped structures, gate structures, CESL, ILD layer, and metal gate elements disclosed in the aforementioned embodiment are labeled with same numberings for simplicity purpose.

Similar to the aforementioned embodiment, the fin-shaped structures 18 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18 could also be obtained by first forming a patterned mask (not shown) on the substrate, 12, and through an etching process, the pattern of the patterned mask is transferred to the substrate 12 to form the fin-shaped structures 18. Moreover, the formation of the fin-shaped structures 18 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 18. These approaches for forming fin-shaped structure are all within the scope of the present invention. After the fin-shaped structures 18 are formed, a liner 22 made of silicon oxide could be formed on the surface of the fin-shaped structures 18.

Next, a shallow trench isolation (STI) 20 is formed around the fin-shaped structures 18. In this embodiment, the formation of the STI 20 could be accomplished by conducting a flowable chemical vapor deposition (FCVD) process to form a silicon oxide layer on the substrate 12 and covering the fin-shaped structures 18 entirely. Next, a chemical mechanical polishing (CMP) process along with an etching process are conducted to remove part of the silicon oxide layer so that the top surface of the remaining silicon oxide is slightly lower than the top surface of the fin-shaped structures 18 for forming the STI 20.

Next, as shown in FIG. 9, an etching process is conducted by using a patterned mask (not shown) as mask to remove part of the liner 22 and part of the fin-shaped structures 18 to form a trench 24, in which the trench 24 preferably divides the fin-shaped structure 18 into two portions, including a portion 26 on the left side of the trench 24 and a portion 28 on the right side of the trench 24.

Figure 10:
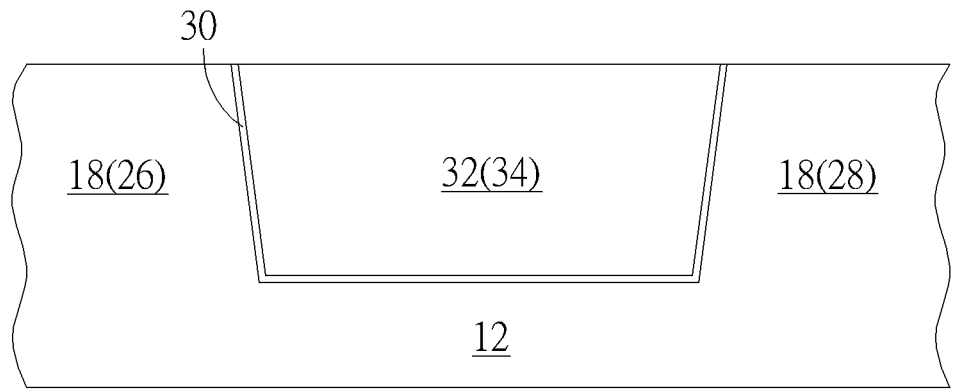

Next, as shown in FIG. 10, an oxidation process is conducted to form another liner 30 made of silicon oxide in the trench 24, in which the liner 30 is disposed on the bottom surface and two sidewalls of the trench 24 and contacting the liner 22 directly. Next, a dielectric layer 32 is formed in the trench 24 to fill the trench 24 completely, and a planarizing process such as chemical mechanical polishing (CMP) process and/or etching process is conducted to remove all of the liner 22 and part of the dielectric layer 32 so that the top surface of the remaining dielectric layer 32 is even with or slightly higher than the top surface of the fin-shaped structure 18. This forms a SDB structure 34 in the fin-shaped structure.

As shown in FIG. 8, each of the fin-shaped structures 18 are disposed extending along a first direction (such as X-direction) while the SDB structure 34 is disposed extending along a second direction (such as Y-direction), in which the first direction is orthogonal to the second direction.

It should be noted that the dielectric layer 32 and the liner 30 in this embodiment are preferably made of different materials, in which the liner 30 is preferably made of silicon oxide and the dielectric layer 32 is made of silicon oxycarbonitride (SiOCN). Specifically, the SDB structure 34 made of SiOCN in this embodiment preferably has low stress, in which the concentration proportion of oxygen within SiOCN is preferably between 30% to 60% and the stress of the SDB structure 34 is between 100 MPa to −500 MPa or most preferably at around 0 MPa. In contrast to the conventional SDB structures made of dielectric material such as silicon oxide or silicon nitride, the SDB structures of this embodiment made of low stress material such as SiOCN could increase the performance of on/off current in each of the transistors thereby boost the performance of the device.

Figure 11:
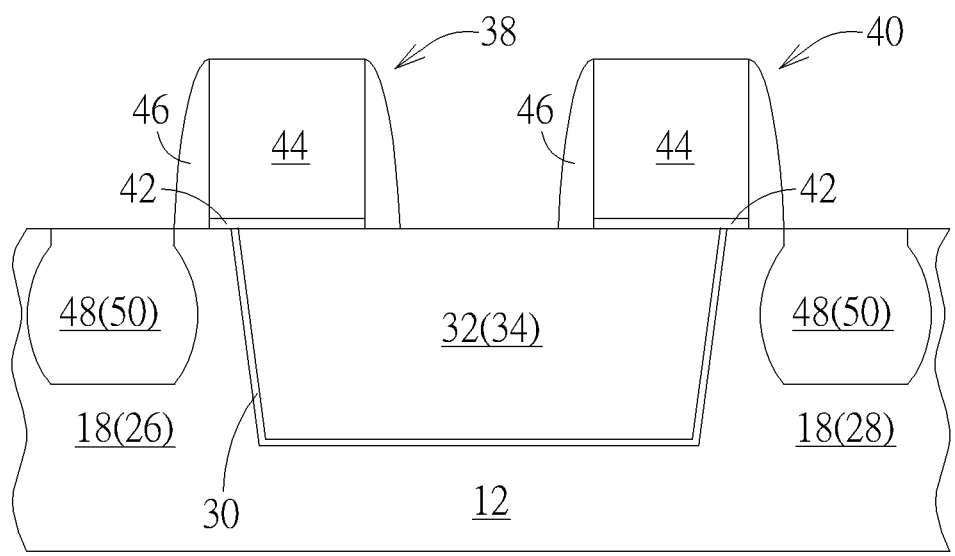

Next, as shown in FIG. 11, more than one gate structures such as gate structures 38, 40 or dummy gates are formed on the fin-shaped structure 18 and the SDB structure 34 as each of the gate structures 38, 40 overlaps the fin-shaped structure 18 and the SDB structure 34 at the same time. In contrast to the gate structures 38, 40 of the aforementioned embodiment are disposed on the NMOS region 14 and PMOS region 16 respectively, both the gate structures 38, 40 in this embodiment are disposed on the same transistor region such as a NMOS region or PMOS region. In this embodiment, the formation of the gate structure 38, 40 could be accomplished by a gate first process, a high-k first approach from gate last process, or a high-k last approach from gate last process. Since this embodiment pertains to a high-k last approach, a gate dielectric layer 42 or interfacial layer, a gate material layer 44 made of polysilicon, and a selective hard mask could be formed sequentially on the substrate 12 or fin-shaped structures 18, and then a sidewall image transfer (SIT) process is conducted to pattern the gate material layer into more than one gate structures.

Preferably, the SIT process could be accomplished by first forming a plurality of mandrels (not shown) on the gate material layer 44. In this embodiment, the fabrication of the mandrels (not shown) could be accomplished by first forming a material layer (not shown) on the gate material layer 44, and a pattern transfer process is conducted by using etching to remove part of the material layer for forming a plurality of patterned material layers serving as mandrels on the gate material layer 44. Preferably, the mandrels could be selected from the group consisting of amorphous silicon, polysilicon, silicon oxide, and silicon nitride, but not limited thereto.

Next, a spacer (not shown) is formed adjacent to each of the mandrels, in which the spacers could be selected from the group consisting of silicon oxide, silicon nitride, silicon oxynitride (SiON), and silicon carbon nitride (SiCN), but not limited thereto. Next, the mandrels are removed completely, and the remaining spacers are used as mask to perform another etching process to pattern or remove part of the gate material layer 44 and gate dielectric layer 42 for forming more than one gate structures such as the gate structures 38, 40 standing on the fin-shaped structure 18 and the SDB structure 34.

Next, at least a spacer 46 is formed on sidewalls of the each of the gate structures 38, 40, a source/drain region 48 and/or epitaxial layer 50 is formed in the fin-shaped structure 18 adjacent to the spacer 46, and selective silicide layers (not shown) could be formed on the surface of the source/drain regions 48. In this embodiment, each of the spacers 46 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof.

The source/drain regions 48 and epitaxial layers 50 could include different dopants and/or different materials depending on the conductive type of the device being fabricated. For instance, the source/drain region 48 on the NMOS region could include n-type dopants and the epitaxial layer 50 on the same region could include silicon phosphide (SiP) while the source/drain region 48 on the PMOS region could include p-type dopants and the epitaxial layer 50 on the same region could include silicon germanium (SiGe). It should be noted that the source/drain regions 48 adjacent to the gate structures 38, 40 are preferably made of same material having same conductive type and the source/drain regions 48 are only formed in the fin-shaped structure 18 adjacent to the gate structures 38, 40 but not within the SDB structure 34 between the gate structures 38, 40.

Figure 12:
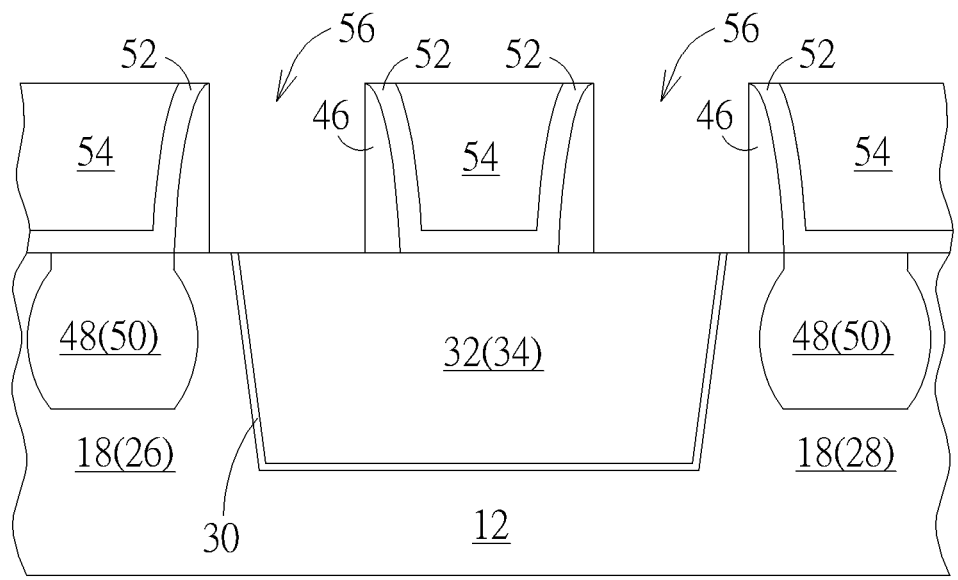

Next, as shown in FIG. 12, a contact etch stop layer (CESL) 52 is formed on the surface of the fin-shaped structures 18 and covering the gate structures 38, 40, and an interlayer dielectric (ILD) layer 54 is formed on the CESL 52. Next, a planarizing process such as CMP is conducted to remove part of the ILD layer 54 and part of the CESL 52 for exposing the gate material layer 44 made of polysilicon, in which the top surface of the gate material layer 44 is even with the top surface of the ILD layer 54.

Next, a replacement metal gate (RMG) process is conducted to transform the gate structures 38, 40 into metal gates 58, 60. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 44 and even gate dielectric layer 42 from the gate structures 38, 40 for forming recesses 56 in the ILD layer 54.

Figure 13:
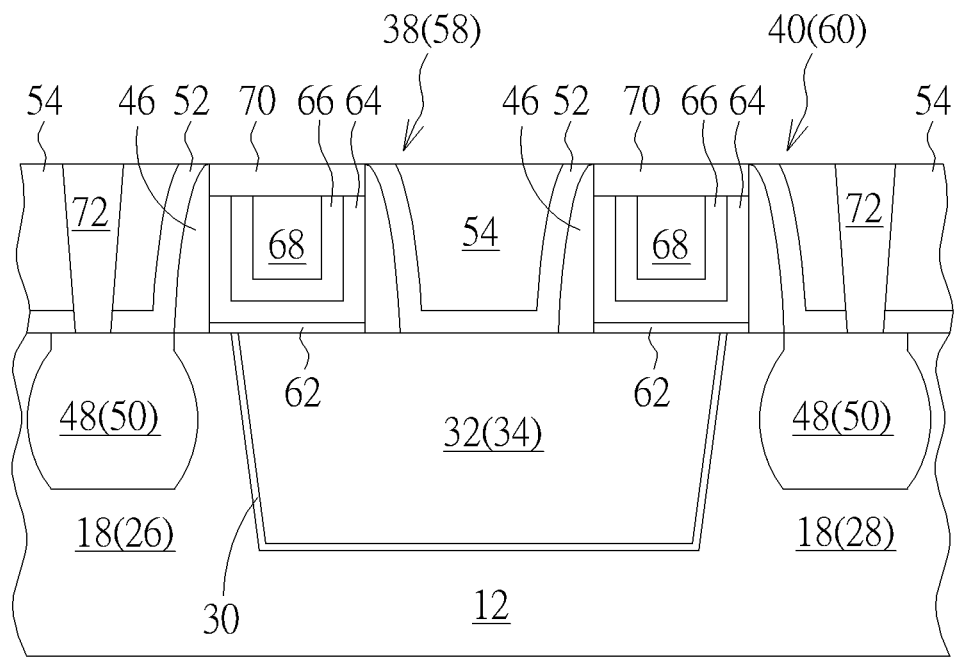

Next, as shown in FIG. 13, a selective interfacial layer or gate dielectric layer 62, a high-k dielectric layer 64, a work function metal layer 66, and a low resistance metal layer 68 are formed in the recesses 56, and a planarizing process such as CMP is conducted to remove part of low resistance metal layer 68, part of work function metal layer 66, and part of high-k dielectric layer 64 to form metal gates 58, 60. Next, part of the low resistance metal layer 68, part of the work function metal layer 66, and part of the high-k dielectric layer 64 are removed to form a recess (not shown) on each of the transistor region, and a hard mask 70 made of dielectric material including but not limited to for example silicon nitride is deposited into the recesses so that the top surfaces of the hard mask 70 and ILD layer 54 are coplanar. In this embodiment, each of the gate structures or metal gates 58, 60 fabricated through high-k last process of a gate last process preferably includes an interfacial layer or gate dielectric layer 62, a U-shaped high-k dielectric layer 64, a U-shaped work function metal layer 66, and a low resistance metal layer 68.

In this embodiment, the high-k dielectric layer 64 is preferably selected from dielectric materials having dielectric constant (k value) larger than 4. For instance, the high-k dielectric layer 64 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 66 is formed for tuning the work function of the metal gate in accordance with the conductivity of the device. For an NMOS transistor, the work function metal layer 66 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 66 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 66 and the low resistance metal layer 68, in which the material of the barrier layer may include titanium (Ti), titanium nitride (TiN), tantalum (Ta) or tantalum nitride (TaN). Furthermore, the material of the low-resistance metal layer 68 may include copper (Cu), aluminum (Al), titanium aluminum (TiAl), cobalt tungsten phosphide (CoWP) or any combination thereof.

Next, a pattern transfer process is conducted by using a patterned mask (not shown) as mask to remove part of the ILD layer 54 and part of the CESL 52 for forming contact holes (not shown) exposing the source/drain regions 48 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 72 electrically connecting the source/drain regions 48. This completes the fabrication of a semiconductor device according to a preferred embodiment of the present invention.

Figure 14:
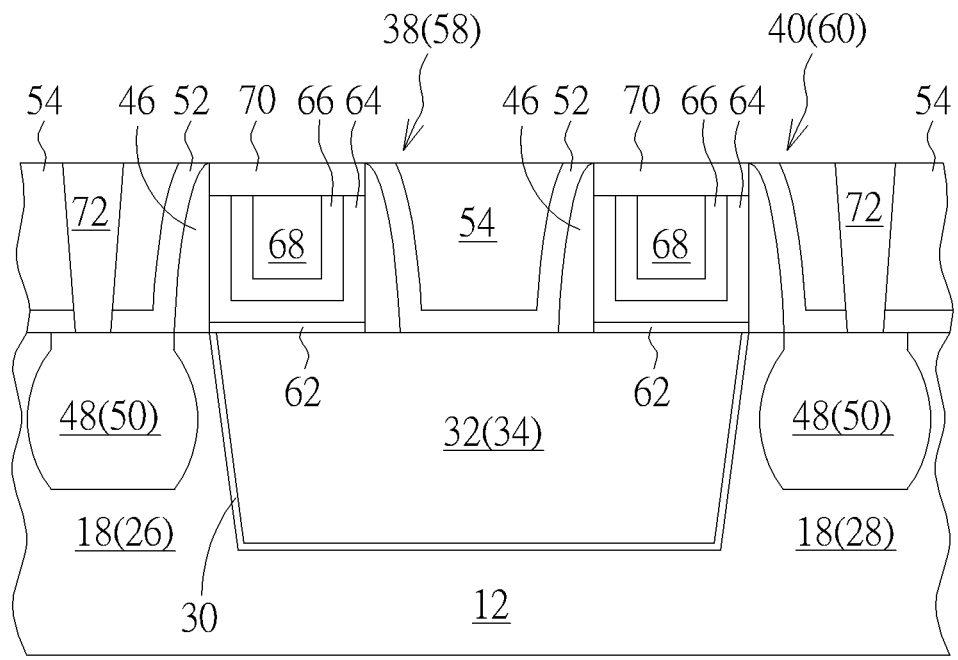
FIG. 14 illustrates a structural view of a semiconductor device according to an embodiment of the present invention.

Referring to FIG. 14, FIG. 14 illustrates a structural view of a semiconductor device according to an embodiment of the present invention. As shown in FIG. 14, in contrast to the aforementioned embodiment of disposing two gate structures 38, 40 on the SDB structure 34 while the gate structures 38, 40 overlapping both the fin-shaped structure 18 and the SDB structure 34 at the same time, it would also be desirable to adjust the position of the gate structures 38, 40 so that the sidewalls of the gate structures 38, 40 are aligned with the sidewalls of the SDB structure 34 as the gate structures 38, 40 are only disposed on top of the SDB structure 34 without overlapping the fin-shaped structure 18, which is also within the scope of the present invention.

Figure 15:
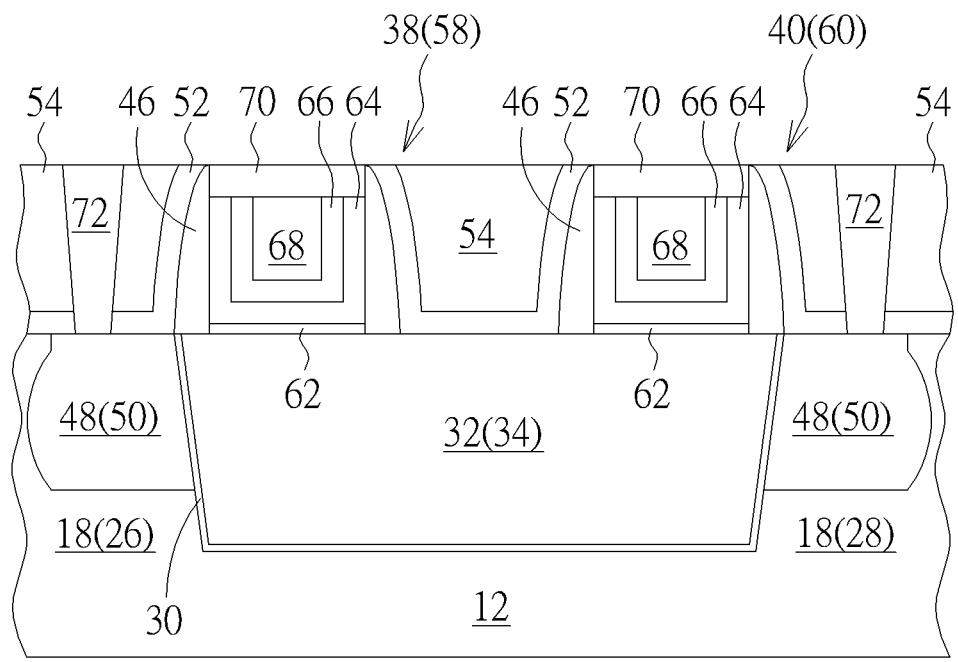
FIG. 15 illustrates a structural view of a semiconductor device according to an embodiment of the present invention.

Referring to FIG. 15, FIG. 15 illustrates a structural view of a semiconductor device according to an embodiment of the present invention. As shown in FIG. 15, in contrast to the embodiment from FIG. 14 of aligning sidewalls of the gate structures 38, 40 to the sidewalls of the SDB structure 34, it would also be desirable to move the gate structures 38, 40 further inward so that the gate structures 38, 40 are disposed on top of the SDB structure 34 and not overlapping the fin-shaped structure 18 while sidewalls of the gate structures 38, 40 are not aligned with edges of the SDB structure 34. Specifically, the sidewalls of the spacers 46 adjacent to the gate structure 38, 40 could be aligned with the sidewalls of the SDB structure 34 in this instance.

Figure 16:
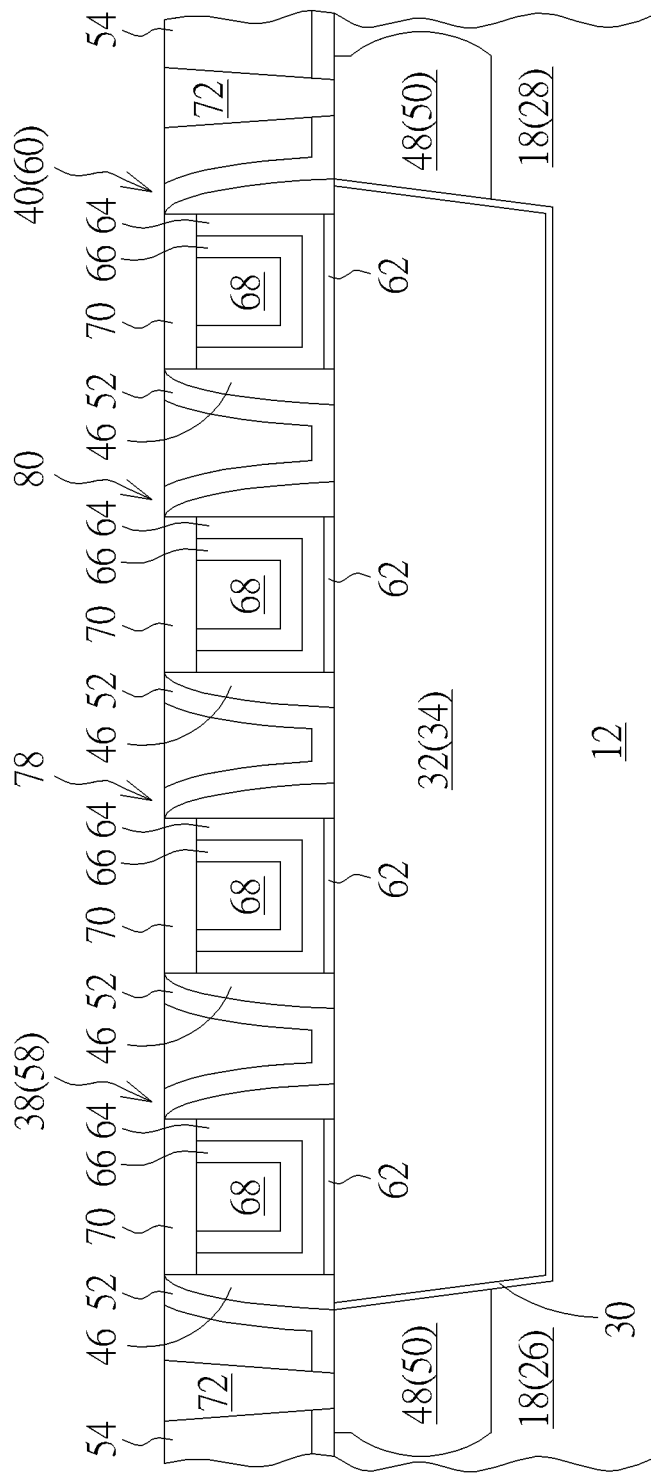
FIG. 16 illustrates a structural view of a semiconductor device according to an embodiment of the present invention.

Referring to FIG. 16, FIG. 16 illustrates a structural view of a semiconductor device according to an embodiment of the present invention. As shown in FIG. 16, in contrast to only disposing two gate structures 38, 40 or metal gates 58, 60 on the SDB structure 34 and the fin-shaped structure 18 in the aforementioned embodiments, it would also be desirable to adjust the pattern of mandrels and spacers used during the SIT process for producing more than two gate structures such as four gate structures on the SDB structure 34 and the fin-shaped structure 18. Preferably, two gate structures 38, 40 or metal gates 58, 60 are disposed on the two sides while two additional gate structures or metal gates 78, 80 are disposed directly on top of the SDB structure 34 and between the metal gates 58, 60 without overlapping the fin-shaped structure 18.

Preferably, the two gate structures 38, 40 or metal gates 58, 60 could be disposed according to the manner suggested in the aforementioned embodiments. For instance, the metal gates 58, 60 could be disposed with sidewalls of spacers 46 aligned to the sidewalls of the SDB structure 34 as shown in FIG. 16, the metal gates 58, 60 could be disposed with sidewalls of the metal gates 58, 60 aligned to the sidewalls of the SDB structure 34 as shown in FIG. 14, or the metal gates 58, 60 could be disposed while overlapping the SDB structure 34 and fin-shaped structure 18 at the same time as shown in FIG. 13, which are all within the scope of the present invention. It should be noted that through SIT process, it would be desirable to reduce the size of the gate structures being formed so that more than one gate structures or metal gates could be formed on the SDB structure 34 and/or fin-shaped structure 18 at the same time while maintaining the size of the SDB structure 34.

Figure 17:
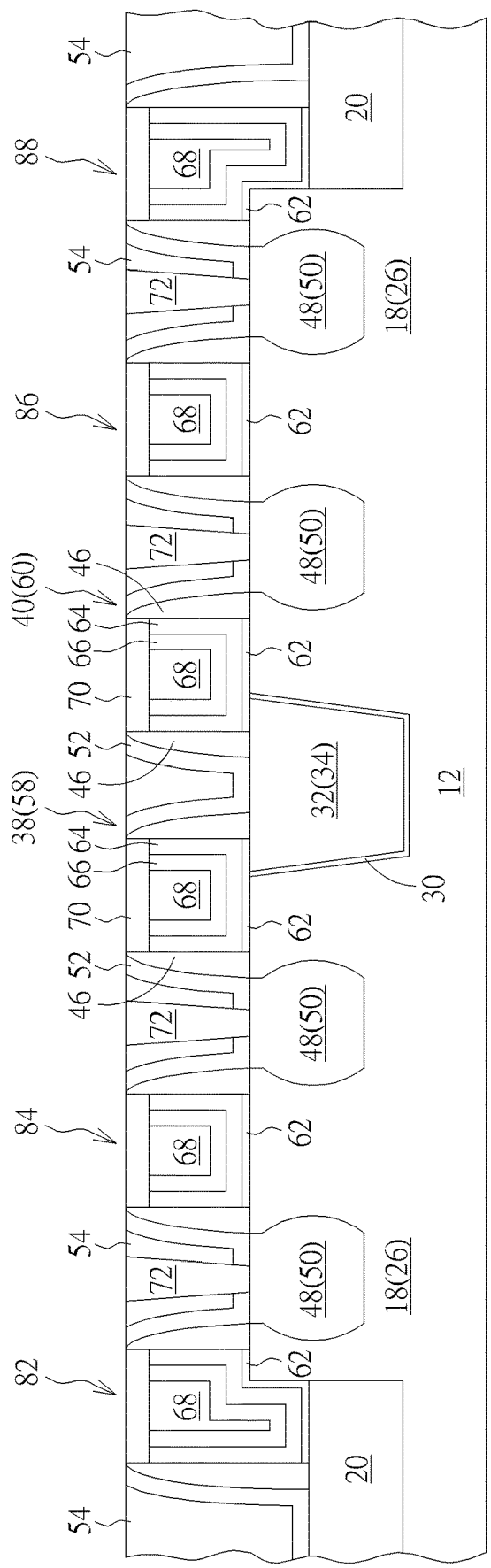
FIG. 17 illustrates a structural view of a semiconductor device according to an embodiment of the present invention.

Referring to FIG. 17, FIG. 17 illustrates a structural overview of a semiconductor device taken along the sectional line DD' of FIG. 8 according to an embodiment of the present invention. As shown in FIG. 17, the aforementioned gate structures 38, 40 or metal gates 58, 60 are disposed on the SDB structure 34 and/or fin-shaped structures 18, two gate structures or metal gates 82, 88 are disposed on edges of the fin-shaped structures 18 and the STI 20 at the same time, a gate structure or metal gate 84 is disposed on the fin-shaped structure 18 between metal gates 58, 80, and another gate structure or metal gate 86 is disposed on the fin-shaped structure 18 between metal gates 60, 88. Preferably, the top surface of the SDB structure 34 is even with the top surface of the fin-shaped structure 18 while the top surface of the STI 20 is lower than the top surfaces of the fin-shaped structure 18 and the SDB structure 34. The bottom surface of the SDB structure 34 could be even with the bottom surface of the STI 20 in this instance or could be lower than or higher than the bottom surface of the STI 20 according to other embodiments of the present invention, which are all within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a fin-shaped structure on a substrate;
   a single diffusion break (SDB) structure in the fin-shaped structure to divide the first fin-shaped structure into a first portion and a second portion; and
   more than two gate structures on the SDB structure, wherein the more than two gate structures comprise:
   a first gate structure, a second gate structure, and a third gate structure on the SDB structure.

2. The semiconductor device of claim 1, wherein the first gate structure overlaps the fin-shaped structure and the SDB structure.

3. The semiconductor device of claim 1, wherein the second gate structure overlaps the fin-shaped structure and the SDB structure.

4. The semiconductor device of claim 1, further comprising:
   a fourth gate structure on the SDB structure.

5. The semiconductor device of claim 4, wherein the third gate structure and the fourth gate structure are between the first gate structure and the second gate structure.

6. The semiconductor device of claim 1, wherein the fin-shaped structure is disposed extending along a first direction and the SDB structure is disposed extending along a second direction.

7. The semiconductor device of claim 6, wherein the first direction is orthogonal to the second direction.

8. The semiconductor device of claim 1, wherein the SDB structure comprises silicon oxycarbonitride (SiOCN).

9. The semiconductor device of claim 8, wherein a concentration proportion of oxygen in SiOCN is between 30% to 60%.

10. The semiconductor device of claim 1, wherein a stress of the SDB structure is between 100 MPa to-500 MPa.

* * * * *